(12) United States Patent
Pegna et al.

(10) Patent No.: US 12,133,465 B2
(45) Date of Patent: Oct. 29, 2024

(54) MULTILAYER FUNCTIONAL FIBER AND METHOD OF MAKING

(71) Applicant: FREE FORM FIBERS, LLC, Saratoga Springs, NY (US)

(72) Inventors: Joseph Pegna, Saratoga Springs, NY (US); Erik G. Vaaler, Redwood City, CA (US); John L. Schneiter, Cohoes, NY (US); Shay L. Harrison, East Schodack, NY (US)

(73) Assignee: Free Form Fibers, LLC, Saratoga Springs, NY (US)

( * ) Notice: Subject to any disclaimer, the term of this patent is extended or adjusted under 35 U.S.C. 154(b) by 0 days.

(21) Appl. No.: 15/592,726

(22) Filed: May 11, 2017

(65) Prior Publication Data

US 2017/0331022 A1   Nov. 16, 2017

Related U.S. Application Data

(60) Provisional application No. 62/334,607, filed on May 11, 2016, provisional application No. 62/334,622, filed on May 11, 2016.

(51) Int. Cl.
  *C23C 16/48* (2006.01)
  *H10N 10/01* (2023.01)
  (Continued)

(52) U.S. Cl.
  CPC ........... *H10N 10/81* (2023.02); *C23C 16/483* (2013.01); *H10N 10/01* (2023.02); *H10N 30/06* (2023.02);
  (Continued)

(58) Field of Classification Search
  CPC ........ H01N 10/81; H01N 10/01; H01N 30/06; H01N 30/702; H01N 30/87; H01N 10/10; C23C 16/483
  See application file for complete search history.

(56) References Cited

U.S. PATENT DOCUMENTS 3,062,683 A   11/1962   Kalleberg et al.
3,103,476 A   9/1963   Mumm
(Continued)

FOREIGN PATENT DOCUMENTS

CN   103387230 A   11/2013
EP   1 209 123 A2   5/2009
(Continued)

OTHER PUBLICATIONS

Zedlitz, R., Heintze, M., Schubert, M.B., "Properties of Amorphous Boron Nitride Thin Films", 1996, Journal of Non-Crystalline Solids, p. 198-200 (Year: 1996).*
(Continued)

*Primary Examiner* — Katherine A Bareford
*Assistant Examiner* — Christina D McClure
(74) *Attorney, Agent, or Firm* — Kevin P. Radigan, Esq.; Heslin Rothenberg Farley & Mesiti P.C.

(57) ABSTRACT

A method is provided for making a multilayer functional fiber, where the method includes: providing a scaffold fiber; disposing a first electrode layer enclosing the scaffold fiber; disposing a functional layer enclosing the first electrode layer, the functional layer having a functional characteristic varying as a function of longitudinal position along the functional layer; disposing a second electrode layer enclosing the functional layer; and disposing a cladding layer enclosing the second electrode layer. In another aspect, a multilayer functional fiber is provided produced by, for instance, the above-noted method.

16 Claims, 6 Drawing Sheets

(51) Int. Cl.
*H10N 10/81* (2023.01)
*H10N 30/00* (2023.01)
*H10N 30/06* (2023.01)
*H10N 30/87* (2023.01)
*H10N 10/10* (2023.01)

(52) U.S. Cl.
CPC .......... *H10N 30/702* (2024.05); *H10N 30/87* (2023.02); *H10N 10/10* (2023.02)

(56) References Cited

U.S. PATENT DOCUMENTS

| | | | |
|---|---|---|---|
| 3,148,102 A | 9/1964 | Eakins et al. | |
| 3,285,825 A | 11/1966 | Jens | |
| 3,308,031 A | 3/1967 | Pon | |
| 3,755,061 A | 8/1973 | Schurb | |
| 3,855,061 A | 12/1974 | Triggiani et al. | |
| 3,958,406 A | 5/1976 | Corbiere | |
| 4,076,380 A | 2/1978 | DiMarcello | |
| 4,539,248 A | 9/1985 | Brockington et al. | |
| 4,588,699 A | 5/1986 | Brennan et al. | |
| 4,751,044 A | 6/1988 | Hwang et al. | |
| 4,962,070 A | 10/1990 | Sullivan | |
| 5,094,804 A | 3/1992 | Schweitzer | |
| 5,096,739 A | 3/1992 | Strutt et al. | |
| 5,126,200 A | 6/1992 | Nordine | |
| 5,134,020 A | 7/1992 | Cotteret et al. | |
| 5,147,598 A | 9/1992 | Kapil | |
| 5,296,288 A | 3/1994 | Kourtides et al. | |
| 5,326,731 A | 7/1994 | Bhola et al. | |
| 5,342,022 A | 8/1994 | Artjushenko et al. | |
| 5,349,618 A | 9/1994 | Greenspan | |
| 5,399,430 A | 3/1995 | Nordine et al. | |
| 5,705,122 A | 1/1998 | Curran | |
| 5,786,023 A | 7/1998 | Maxwell et al. | |
| 5,867,552 A | 2/1999 | Marlowe et al. | |
| 5,955,391 A | 9/1999 | Kameda et al. | |
| 6,080,690 A * | 6/2000 | Lebby .................. | A41D 31/00 442/212 |
| 6,271,802 B1 | 8/2001 | Clark et al. | |
| 6,291,058 B1 | 9/2001 | Goujard et al. | |
| 6,322,889 B1 | 11/2001 | Lara-Curzio et al. | |
| 6,323,413 B1 | 11/2001 | Roth et al. | |
| 6,359,374 B1 * | 3/2002 | Dausch ................ | H01H 50/005 310/330 |
| 6,706,400 B2 | 3/2004 | Mercuri et al. | |
| 7,657,142 B2 | 2/2010 | Gasca et al. | |
| 7,666,475 B2 | 2/2010 | Morrison | |
| 7,888,475 B2 | 2/2011 | Padgett | |
| 9,206,508 B1 | 12/2015 | Hariharan et al. | |
| 9,217,210 B2 | 12/2015 | Velev et al. | |
| 9,658,087 B1 | 5/2017 | Baur et al. | |
| 9,938,393 B2 | 4/2018 | Schneiter et al. | |
| 10,047,015 B2 | 8/2018 | Pegna et al. | |
| 10,546,661 B2 | 1/2020 | Pegna et al. | |
| 10,676,391 B2 | 6/2020 | Harrison et al. | |
| 10,876,227 B2 | 12/2020 | Harrison et al. | |
| 10,882,749 B2 | 1/2021 | Pegna et al. | |
| 11,362,256 B2 | 6/2022 | Pegna et al. | |
| 2002/0085968 A1 | 7/2002 | Smalley et al. | |
| 2003/0168146 A1 | 9/2003 | Wenstrup et al. | |
| 2005/0048859 A1 | 3/2005 | Canahan et al. | |
| 2005/0082676 A1 | 4/2005 | Andry et al. | |
| 2005/0146076 A1 * | 7/2005 | Alexander .............. | B29C 70/24 264/257 |
| 2005/0181192 A1 | 8/2005 | Steffier | |
| 2005/0247904 A1 | 11/2005 | Raj et al. | |
| 2005/0255033 A1 | 11/2005 | Shimoji et al. | |
| 2006/0039524 A1 | 2/2006 | Feinroth et al. | |
| 2006/0115648 A1 | 6/2006 | Chen | |
| 2007/0063226 A1 | 3/2007 | Tanaka et al. | |
| 2007/0093587 A1 | 4/2007 | Shen et al. | |
| 2008/0143209 A1 | 6/2008 | Tan et al. | |
| 2008/0153959 A1 | 6/2008 | Charati et al. | |
| 2008/0175988 A1 | 7/2008 | Chiu et al. | |
| 2009/0064476 A1 | 3/2009 | Cross et al. | |
| 2009/0220040 A1 | 9/2009 | Takagi | |
| 2010/0040834 A1 | 2/2010 | Dawes et al. | |
| 2010/0055352 A1 | 3/2010 | Maxwell | |
| 2010/0261058 A1 | 10/2010 | Lopatin et al. | |
| 2010/0320171 A1 * | 12/2010 | Mao ..................... | B82Y 10/00 216/65 |
| 2011/0124483 A1 | 5/2011 | Shah et al. | |
| 2011/0170653 A1 | 7/2011 | Cabrero et al. | |
| 2011/0274906 A1 | 11/2011 | Kim et al. | |
| 2011/0286570 A1 | 11/2011 | Farmer et al. | |
| 2012/0002777 A1 | 1/2012 | Lahoda et al. | |
| 2012/0076718 A1 | 3/2012 | Liu et al. | |
| 2012/0135224 A1 | 5/2012 | Guzman de Villoria et al. | |
| 2012/0207264 A1 | 8/2012 | Van Den Berghe et al. | |
| 2012/0287553 A1 | 11/2012 | Ramani et al. | |
| 2012/0315467 A1 | 12/2012 | Lafdi et al. | |
| 2012/0315815 A1 | 12/2012 | Fong et al. | |
| 2013/0010915 A1 | 1/2013 | Garnier et al. | |
| 2013/0077731 A1 | 3/2013 | Sherwood et al. | |
| 2013/0093122 A1 | 4/2013 | Schultz et al. | |
| 2013/0106245 A1 * | 5/2013 | Giebe .................. | H01L 41/25 310/340 |
| 2013/0163711 A1 | 6/2013 | Zabiego et al. | |
| 2013/0329849 A1 | 12/2013 | Mazaudier | |
| 2014/0170919 A1 | 6/2014 | Manipatruni et al. | |
| 2015/0004393 A1 | 1/2015 | Pegna et al. | |
| 2016/0215417 A1 | 7/2016 | Schneiter et al. | |
| 2016/0347672 A1 | 12/2016 | Harrison et al. | |
| 2017/0326838 A1 | 11/2017 | Pegna et al. | |
| 2017/0331022 A1 | 11/2017 | Pegna et al. | |
| 2017/0369998 A1 | 12/2017 | Pegna et al. | |
| 2018/0087157 A1 | 3/2018 | Harrison et al. | |
| 2018/0087214 A1 | 3/2018 | Harrison et al. | |
| 2018/0370860 A1 | 12/2018 | Pegna et al. | |
| 2019/0047047 A1 | 2/2019 | Mark | |
| 2020/0203028 A1 | 6/2020 | Pegna et al. | |
| 2021/0087726 A1 | 3/2021 | Pegna et al. | |
| 2021/0222332 A1 | 7/2021 | Harrison et al. | |
| 2021/0230743 A1 | 7/2021 | Harrison et al. | |
| 2021/0253434 A1 | 8/2021 | Pegna et al. | |
| 2022/0064798 A1 | 3/2022 | Schneiter et al. | |
| 2022/0144711 A1 | 5/2022 | Harrison et al. | |

FOREIGN PATENT DOCUMENTS

| | | |
|---|---|---|
| GB | 2054542 B | 1/1983 |
| GB | 2553390 A | 3/2018 |
| JP | 61-132628 A | 6/1986 |
| JP | 01252780 A * | 10/1989 |
| JP | H 01-252780 A | 10/1989 |
| JP | H 03-285877 A | 12/1991 |
| JP | H 07-252662 A | 3/1995 |
| JP | 09-268065 A | 10/1997 |
| JP | H 10-059780 A | 3/1998 |
| JP | 2002-211980 A | 7/2002 |
| JP | 2005-231952 A | 9/2005 |
| JP | 2013-210372 A | 10/2013 |
| JP | 2015-021754 A | 2/2015 |
| WO | WO 1988/001204 A1 | 2/1988 |
| WO | WO 2010/090624 A1 | 8/2010 |
| WO | WO 2012/109841 A1 | 8/2012 |
| WO | WO 2013/180764 A1 | 12/2013 |
| WO | WO 2014/143937 A1 | 9/2014 |
| WO | WO 2015/200257 A1 | 12/2015 |

OTHER PUBLICATIONS

JP-01252780-A, machine translation, originally published 1989, p. 1-4 (Year: 1989).*

Hampden-Smith, M.J., Kodas, T.T., "Chemical Vapor Deposition of Metals: Part 1. an Overview of CVD Processes", 1995, Chem. Vap. Deposition, p. 8-23 (Year: 1995).*

Shi, et al., "Synthesis of Carbon Nanotubes by Laser-Assisted Chemical Vapor Deposition", 2006, SPIE, p. 61070M-1-61070M-8 (Year: 2006).*

(56) References Cited

OTHER PUBLICATIONS

International Search Report (ISR) & Written Opinion for PCT Application No. PCT/US2017/032149, dated Aug. 10, 2017 (11 pages).
Wen et al., "Interfacial Microstructure and Reaction of BN-Coated Single Crystal Al2O3 Fiber Reinforced NiAl Matrix Composites", Journal of Materials Science, vol. 37, No. 6, Mar. 1, 2002 (pp. 1253-1258).
Behlau et al., "Mechanical Properties of Carbon and BN Coated SiC Fibers", Ceramic Engineering and Science Proceedings, vol. 24, No. 4, Jan. 1, 2003 (pp. 225-230).
Chen et al., "Carbide Derived Carbon (CDC) Coatings for Tyranno ZMI SiC Fibers", Ceramic Engineering and Science Proceedings, vol. 24, No. 3, Jan. 26, 2003 (pp. 57-62).
Chen et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).
Liu et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, Oct. 1, 2008 (pp. 3670-3672).
Jouanny et al., "Study of TiC Coatings on Nicalon Fibre Prepared by Pressure-Pulsed Reactive Chemical Vapour Deposition at Low Pressure", ECS Translations, vol. 25, No. 8, Jan. 1, 2009 (pp. 1267-1272).
Marsh, John H., "Quantum Well Intermixing Revolutionizes High Power Laser Diodes", Diodenlaser, LTJ No. 5, 4:32-35, doi:10.1002/latj.200790190 (Nov. 2007) (4 pages).
International Search Report & Written Opinion for PCT Application No. PCT/US2013/022053, filed Jan. 18, 2013 (PCT Publication No. WO 2013/180764 A1), dated Nov. 1, 2013 (15 pages).
Glazoff et al., "Morphological Analysis of Zirconium Nuclear Fuel Rods Braided with SiC: Qality Assurance and Defect Identification", Journal of Nuclear Materials, 451.1 (Apr. 12, 2014) (pp. 216-224).
Pegna et al., International Search Report & Written Opinion for PCT/US2015/037080 (PCT Publication No. WO 2015/200257 A1), dated Oct. 23, 2015 (10 pages).
Pegna et al., Communication and Extended European Search Report (EESR) for EP Application No. 13796908.5, dated Feb. 9, 2016 (20 pages).
Pegna et al., "An Additive Manufacturing Technology for the Fabrication and Characterization of Nuclear Reactor Fuel", U.S. Appl. No. 15/320,800, filed Dec. 21, 2016 (56 pages).
Pegna et al., "Fiber Delivery Assembly and Method of Making", U.S. Appl. No. 15/592,408, filed May 11, 2017 (25 pages).
Ares, et al. "Columnar-to-Equiaxed Transition in Metal-Matrix Composites Reinforced with Silicon Carbide Particles", Hindawi Publishing Corporation, Journal of Metallurgy, vol. 2013, Article ID 628495, 12 pages.
Duty et al., "Z-Pinning Approach for 3D Printing Mechanically Isotropic Materials", Additive Manufacturing, vol. 27, pp. 175-184 (May 2019) (Year: 2019).
Gan, Yong X., "Structural Assessment of Nanocomposites", Micron, vol. 43, Issue 7, (2012) pp. 782-817.
Hampden-Smith et al., "Chemical Vapor Deposition Metals: Part 1. An Overview of CVD Processes", 1995, Chem. Vap. Deposition, pp. 8-23 (Year: 1995).
Hu, et al., "Oxidation Behavior of Zirconium Diboride-Silicon Carbide at 1800°C", Scripta Materialia, vol. 57, No. 9, (Nov. 2007), pp. 825-828.
Jiang et al., "Fabrication of Barium-Strontium Aluminosilicate Coatings on C/SiC Composites via Laser Cladding", Journal of Materials Science & Technology, vol. 33, No. 2, (2017), pp. 166-171.
Johansson et al., "Microfabrication of Three-Dimensional Boron Structures by Laser Chemical Processing", Journal of Applied Physics, vol. 72, No. 12, (1992), (8 pages).

Kerans, et al., "High Temperature Composites", Air Force Research Laboratory Report No. AFRL-ML-WP-TP-2002-407, (Aug. 2002), (22 pages).
Kerans, et al., "Interface Design for Oxidation-Resistant Ceramic Composites", Journal of the American Ceramic Society, vol. 85, No. 11, (Nov. 2002), pp. 2599-2632.
Lee, et al., "Microstructure and Mechanical Properties of Al2O3/Y3Al5O12/ZrO2 Ternary Eutectic Materials", Journal of European Ceramic Society, vol. 25, No. 8, (Jan. 2005), pp. 1411-1417.
Liao, et al., "Large-Scale Aligned Silicon Carbonitride Nanotube Arrays: Synthesis, Characterization, and Field Emission Property", Journal of Applied Physics, vol. 101, No. 11, (Jun. 2007), pp. 114306.1-114306.4.
Longtin, et al., "Selective Area Synthesis of Aligned Carbon Nanofibers by Laser-Assisted Catalytic Chemical Vapor Deposition", Diamond & Related Materials, vol. 16 (2007) pp. 1541-1549.
Longtin, et al., "Synthesis of Carbon Nanofiber Films and Nanofiber Composite Coatings by Laser-Assisted Catalytic Chemical Vapor Deposition", Thin Solid Films, vol. 515, No. 5, (2007) pp. 2958-2964.
Luo, et al., "Microstructure, Tensile Strength and Thermostability of W-core SiC Fibers With or Without Carbon Coating", Materials Science & Engineering: A, vol. 647, (2015), pp. 265-276.
Maxwell, et al., "Real-Time Volumetric Growth Rate Measurements and Feedback Control of Three-Dimensional Laser Chemical Vapor Deposition", Appl. Phys. A, vol. 67, No. 3, (1998), pp. 323-329.
Maxwell, et al., "Preparation of Superhard BxCy Fibers by Microvortex-Flow Hyperbaric Laser Chemical Vapor Deposition", Diamond & Related Materials, vol. 16, Issue 8, (Jan. 2007), pp. 1557-1564.
Maxwell et al., "High Temperature Nanocomposites for Nuclear Thermal Propulsion and In-Space Fabrication by Hyperbaric Pressure Laser Chemical Vapor Deposition", Journal of the British Interplanetary Society (JBIS), vol. 66, pp. 328-333 (Year: 2013).
Rosso, M., "Ceramic and Metal Metrix Composites: Routes and Properties", Journal of Materials Processing Technology, vol. 175 (2006), pp. 364-375 (Year: 2006).
Roy, et al., "Atomic Layer Deposition of Alumina Onto Carbon Fibers", Journal of the American Ceramic Society, vol. 94, No. 7, (Jul. 2011), pp. 2014-2022.
Shi et al., "Synthesis of Carbon Nanotubes by Laswer-Assisted Chemical Vapor Deposition", SPIE, p. 61070M-1-61070M-8 (Year: 2006).
Waku, et al., "An Amorphous Ceramic A132.4Er7.6060 Fiber with Large Viscous Flow Deformation and a High-Strength Nanocrystallized Ceramic Fiber", Journal of Materials Science, vol. 36, No. 10, (May 2001), pp. 2435-2440.
Wallenberger et al., "Strong, Small Diameter, Boron Fibers by LCVD", Materials Letters, vol. 14 (1992), pp. 198-202.
Wallenberger, Frederick T., "Inorganic Fibres and Microfabricated Parts by Laser Assisted Chemical Vapour Deposition (LCVD): Structures and Properties*", Ceramics International, vol. 23, (1997), pp. 119-126.
Wang, Mengxiao, M.S., "UV Laser-Assisted Diamond Deposition", The Graduate College at the University of Nebraska, (Nov. 2014), (100 pages), http://digitalcommons.uni.edu/cgi/viewcontent.cgi?article=1068&context=elecengtheses.
Wang, et al., "Synthesis of ZrC—SiC Powders from Hybrid Liquid Precursors with Improved Oxidation Resistance", Journal of the American Ceramic Society, vol. 98, No. 1, (Jan. 2015), pp. 197-204.
Zedlitz et al., "Properties of Amorphous Boron Nitride Thin Films", 1996, Journal of Non-Crystalline Solids, p. 198-200 (Year: 1996).
Zhang, et al., "Ferromagnetism Induced by Intrinsic Defects and Boron Substitution in Single-Wall SiC Nanotubes", Journal of Physical Chemistry, vol. 115, No. 35, (Sep. 2011), pp. 9987-9992.
Zimmerman, et al. "Fragmentation-Driven Grain Refinement in Directional Solidification of AlCu10wit-% Alloy at Low Pulling Speeds", Acta Materialia, vol. 126, (2017) pp. 236-250.

\* cited by examiner

FIG. 6 ic fiber substrate, a reactor cube into
MULTILAYER FUNCTIONAL FIBER AND METHOD OF MAKING

CROSS-REFERENCE TO RELATED APPLICATION

This application claims the benefit of U.S. provisional patent application Ser. No. 62/334,607, filed May 11, 2016, entitled "Multilayer Functional Fiber and Method of Making", which is hereby incorporated herein by reference in its entirety. In addition, this application claims the benefit of U.S. provisional patent application Ser. No. 62/334,622, filed May 11, 2016, entitled "Fiber Delivery Assembly and Method of Making", which is also hereby incorporated herein by reference in its entirety.

STATEMENT REGARDING GOVERNMENT RIGHTS

Certain aspects of this invention were made with United States Government support under a U.S. Department of Energy Award DE-SC00011954. Accordingly, the U.S. Government may have certain rights in this invention.

BACKGROUND

The present invention relates generally to the field of fibers for reinforcing materials and more specifically to the field of fibers providing specific functionalities, such as, for example, sensing, actuating, energy absorption, energy storage, or combinations thereof.

In a wide variety of applications, fiber composite materials, incorporating fibers into a surrounding material matrix, provide higher structural performance than traditional, non-fiber materials.

SUMMARY

In accordance with one or more aspects, a method of making a multilayer functional fiber is provided, which includes: providing a scaffold fiber; disposing a first electrode layer enclosing the scaffold fiber; disposing a functional layer enclosing the first electrode layer, the functional layer having a functional characteristic varying as a function of longitudinal position along the functional layer; disposing a second electrode layer enclosing the functional layer; and disposing a cladding layer enclosing the second electrode layer.

In another aspect, an advanced additive manufacturing method such as, using laser-assisted chemical vapor deposition to enable the production of multilayer fibers wherein the physical properties of certain layers (functional layers) may be made to vary along the layer length. When incorporated in appropriate circuits, such as electrical, optical, or thermal, these functional layers accomplish specific functions, such as sensing, actuating, energy storage and release, damping, or combinations thereof.

In another aspect, a multilayer functional fiber is provided which includes: a scaffold fiber; and a building block, possibly repeated, consisting of a first electrode layer enclosing the scaffold fiber; a functional layer enclosing the first electrode layer, the functional layer having a functional characteristic varying as a function of longitudinal position along the functional layer; a second electrode layer enclosing the functional layer; and a cladding layer enclosing the second electrode layer.

In another aspect, this invention addresses opportunities to make "smart structures" by providing structures with integral electrical sensing and/or actuating capability. For example, a network of such fibers can be embedded into a composite material, providing what essentially constitutes a "nervous system" of sensors for real-time structural health monitoring, temperature and stress sensing. In yet another example, a network of electrically, mechanically, or thermally activated fibers can be embedded into a composite material to enhance heating or cooling, structural damping, or energy storage and recovery, thereby providing the functional equivalent to biological muscles and vascular systems.

Additional features and advantages are realized through the techniques of the present invention. Other embodiments and aspects of the invention are described in detail herein and are considered a part of the claimed invention.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Aspects of the present invention and certain features, advantages and details thereof, are explained more fully below with reference to the non-limiting example(s) illustrated in the accompanying drawings. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application, for instance, for facilitating providing multilayer functional fibers and methods of making, as described herein.

The present invention incorporates or utilizes the following, alone or in any combination, and/or in combination with the subject matter of commonly assigned, PCT International Application No. PCT/US2015/037080, which published on Dec. 30, 2015, as PCT Patent Publication No. WO 2015/200257 A1, and with commonly assigned U.S. Ser. No. 15/320,800, entitled "An Additive Manufacturing Technology for the Fabrication and Characterization of Nuclear Reactor Fuel", and with commonly assigned U.S. Ser. No. 14/372,085, entitled "High Strength Ceramic Fibers and Methods of Fabrication", which published on Jan. 1, 2015, as U.S. Patent Publication No. 2015/00044393 A1, and with commonly assigned, co-filed U.S. patent application Ser. No. 15/592,408, entitled "Fiber Delivery Assembly and Method of Making", each of which is hereby incorporated herein by reference in its entirety.

Fiber-reinforced composite materials are designed to concomitantly maximize strength and minimize weight. This is achieved by embedding high-strength low-density fibers into a low-density filler matrix in such a way that fibers channel and carry the structural stresses in composite structures. The matrix serves as a glue that holds fibers together and helps transfer loads in shear from fiber to fiber, but in fact the matrix material is not a structural element and carries but a negligible fraction of the overall structural load seen by a composite material.

Composites are thus engineered materials made up of a network of reinforcing fibers sometimes woven, knitted or braided held together by a matrix. Fibers are usually packaged as twisted multifilament yarns called "tows". The matrix gives rise to three self-explanatory classes of composite materials: (1) Polymer Matrix Composites (PMCs), sometimes-called Organic Matrix Composites (OMCs); (2) Metal Matrix Composites (MMC's); and (3) Ceramic Matrix Composites (CMCs).

Such an approach to composite materials in which the tows are but a disorganized bundle of entangled filaments constrains the fibers to a purely structural role. A new approach to the fabrication of multilayered fibers called 1½-D printing allows for the formation of parallel, evenly spaced, parallel filaments. Together, this construct constitutes an arbitrary long ribbon of continuous filaments that allow the fiber to break out of their purely structural functions, and enable sweeping new designs in which the fibers contain embedded microsystems. This is described further in the above-referenced, commonly assigned, co-filed U.S. patent application Ser. No. 15/592,408.

This approach to fiber manufacturing has been proposed for example as a means to produce TRISO-inspired nuclear fuel embedded within fibers for subsequent embedding into a refractory matrix to form an accident tolerant CMC nuclear fuel, such as described in the above-referenced, commonly assigned PCT Patent Publication No. WO 2015/200257 A1. However, this is but one instance of possible new designs enabled by this technology.

At its core, 1½-D printing rests on the physical principles of Laser Induced Chemical Vapor Deposition to both print continuous filaments and deposit patterns coated onto the fiber. U.S. Patent Publication No. 2015/0004493 A1, Pegna et. al., teaches how arrays of filaments can be laser-printed, with diameters potentially varying along their length. The above-referenced, PCT Patent Publication No. WO 2015/200257 A1 teaches how a laser incident to the ribbon can be used to write a pattern of coatings onto a substrate fiber by turning the laser on or off as the ribbon advances. It also teaches that coating thickness can be adjusted. Finally, the above-referenced, commonly assigned and co-filed U.S. patent application Ser. No. 15/592,408, teaches how such ribbons of parallel filaments can be collected as ribbons onto a tape to enhance fiber volume fraction in the composite.

To implement 1½-D printing, Laser Induced Chemical Vapor Deposition (LCVD) was chosen as the fundamental Additive Manufacturing (AM) tool for its near material independence an extremely rare property for AM processes. Such a process is said to be "Material Agnostic". LCVD is a technique derived from CVD, used intensively in the microelectronics fabrication industry (aka "Chip Fab"). CVD builds up electronics-grade high-purity solid deposits from a gas precursor. In its 75+ year history, Chip Fab has accumulated an impressive library of chemical precursors for a wide range of materials, numbering in the 10's of thousands, including fissile material precursors. The main difference between CVD and LCVD resides in dimensionality and mass throughput. CVD is intended for 2-D film growth whereas LCVD is ideally suited for one-dimensional filamentary structures. The dimensionality difference means that deposition mechanisms are greatly enhanced for LCVD vs. CVD, leading to deposited mass fluxes (kg/m2 s) that are 3 to 9 orders of magnitude greater. For example, diamond-like carbon filaments have been measured at linear growth rates upwards of 13 cm/s, which represents a 9 order of magnitude increase in mass flux compared to thin film CVD of the same material. Finally, compared to extant fuel manufacturing, LCVD is essentially containerless, which virtually eliminates opportunities for material contamination by container or tool.

The following fundamental properties formally defines "1½-D Printing" AM

Material-agnostic ability to grow filaments.

Ability to vary diameter along the length of the filament, as illustrated in FIG. 10 of Pegna et al. (PCT Publication No. WO 2015/200257 A1).

Material-agnostic ability to vary composition along the length of the filament, as was demonstrated by Maxwell et al.

Material-agnostic ability to coat specific sections of filaments with a desired material, morphology and thickness; as illustrated by the nanoporous and other spot coatings shown in FIG. 11 of the above-referenced Pegna et al., PCT publication.

Disclosed herein, in part, is the concept of avoiding the use of polymeric precursors altogether by using laser-assisted chemical vapor deposition (LCVD) as is described in U.S. Pat. No. 5,786,023 by Maxwell and Pegna, the entirety of which is hereby incorporated by reference herein. In this process pure precursor gases (such as silane and ethylene in the case of SiC fiber production) are introduced into a reactor within which a suitable substrate such as glassy carbon is positioned, and laser light is focused onto the substrate. The heat generated by the focused laser beam breaks down the precursor gases locally, and the atomic species deposit onto the substrate surface and build up locally to form a fiber. If either the laser or the substrate is pulled away from this growth zone at the growth rate a continuous fiber filament will be produced with the very high purity of the starting gases. With this technique there are virtually no unwanted impurities, and in particular no performance-robbing oxygen.

Very pure fibers can be produced using LCVD, such as silicon carbide, boron carbide, silicon nitride and others. The inventors have discovered that if a material has been deposited using CVD, there is a good chance that fiber can be produced using LCVD. Unlike with liquid polymeric precursors, however, where the chemistry can be very involved and complicated even for relatively 'simple' materials such as those mentioned above, LCVD can also be used quite directly to produce novel mixes of solid phases of different materials that either cannot be made or have not been attempted using polymeric precursor and spinneret technology. Examples include fibers composed of silicon, carbon and nitrogen contributed by the precursor gases such as silane, ethylene and ammonia, respectively, where the resulting "composite" fiber contains tightly integrated phases of silicon carbide, silicon nitride and silicon carbonitrides depending on the relative concentrations of precursor gases in the reactor. Such new and unique fibers can exhibit very useful properties such as high temperature resistance, high strength and good creep resistance at low relative cost.

Disclosed below is a novel multi-component or 'composite' inorganic fiber comprising a nano-scale contiguous collection of a number of tightly packed unique phases of material randomly interspersed throughout the fiber body, without unwanted impurities, and a method for producing same.

Figure 1:
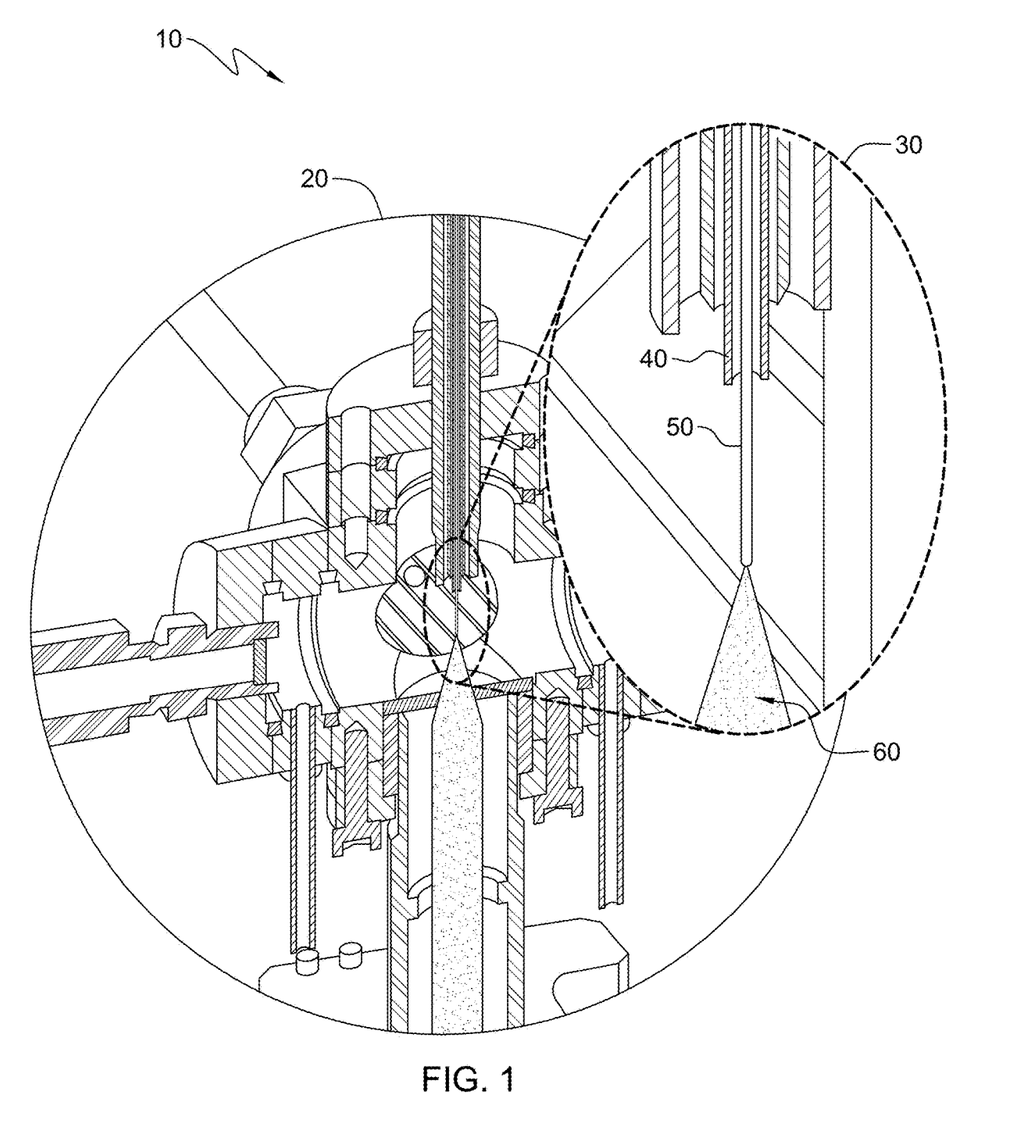
FIG. 1 is a schematic representation of a single-fiber reactor, showing a seed fiber substrate, a reactor cube into which precursor gases are delivered, a focused laser beam impinging on the seed fiber, and reactor windows that are transparent to the incoming laser beam wavelength and allow for video monitoring of the process.

FIG. 1 shows a LCVD reactor into which a substrate seed fiber has been introduced, onto the tip of which a laser beam is focused. (It will be seen that the substrate may be any solid surface capable of being heated by the laser beam. It will further be seen that multiple lasers could be used simultaneously to produce multiple simultaneous fibers as is taught in International Patent Application Serial No. US2013/022053 by Pegna et al.,—also filed on Jul. 14, 2014 as U.S. patent application entitled "High Strength Ceramic Fibers and Methods of Fabrication", U.S. Ser. No. 14/372,085—the entireties of which are hereby incorporated by reference herein.) In accordance with that Application, FIG. 1 more particularly shows a reactor 10; enlarged cutout view of reactor chamber 20; enlarged view of growth region 30. A self-seeded fiber 50 grows towards an oncoming coaxial laser 60 and is extracted through an extrusion microtube 40.

A mixture of precursor gases can be introduced at a desired relative partial pressure ratio and total pressure. The laser is turned on, generating a hot spot on the substrate, causing local precursor breakdown and local CVD growth in the direction of the temperature gradient, typically along the axis of the laser beam. Material will deposit and a fiber will grow, and if the fiber is withdrawn at the growth rate, the hot spot will remain largely stationary and the process can continue indefinitely, resulting in an arbitrarily long CVD-produced fiber.

Figure 2:
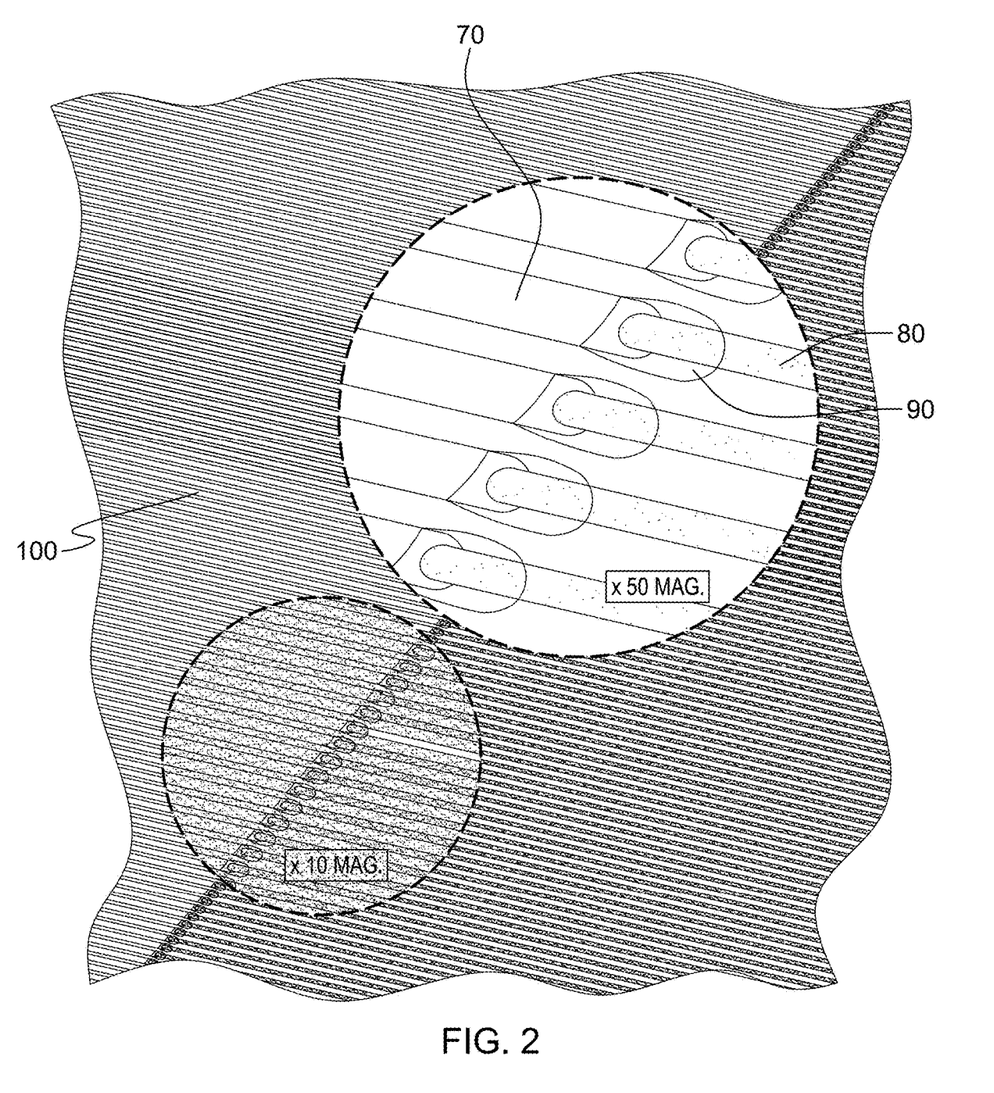
FIG. 2 is a schematic view showing how fiber LCVD can be massively parallelized by multiplication of the laser beams.
Figure 3:
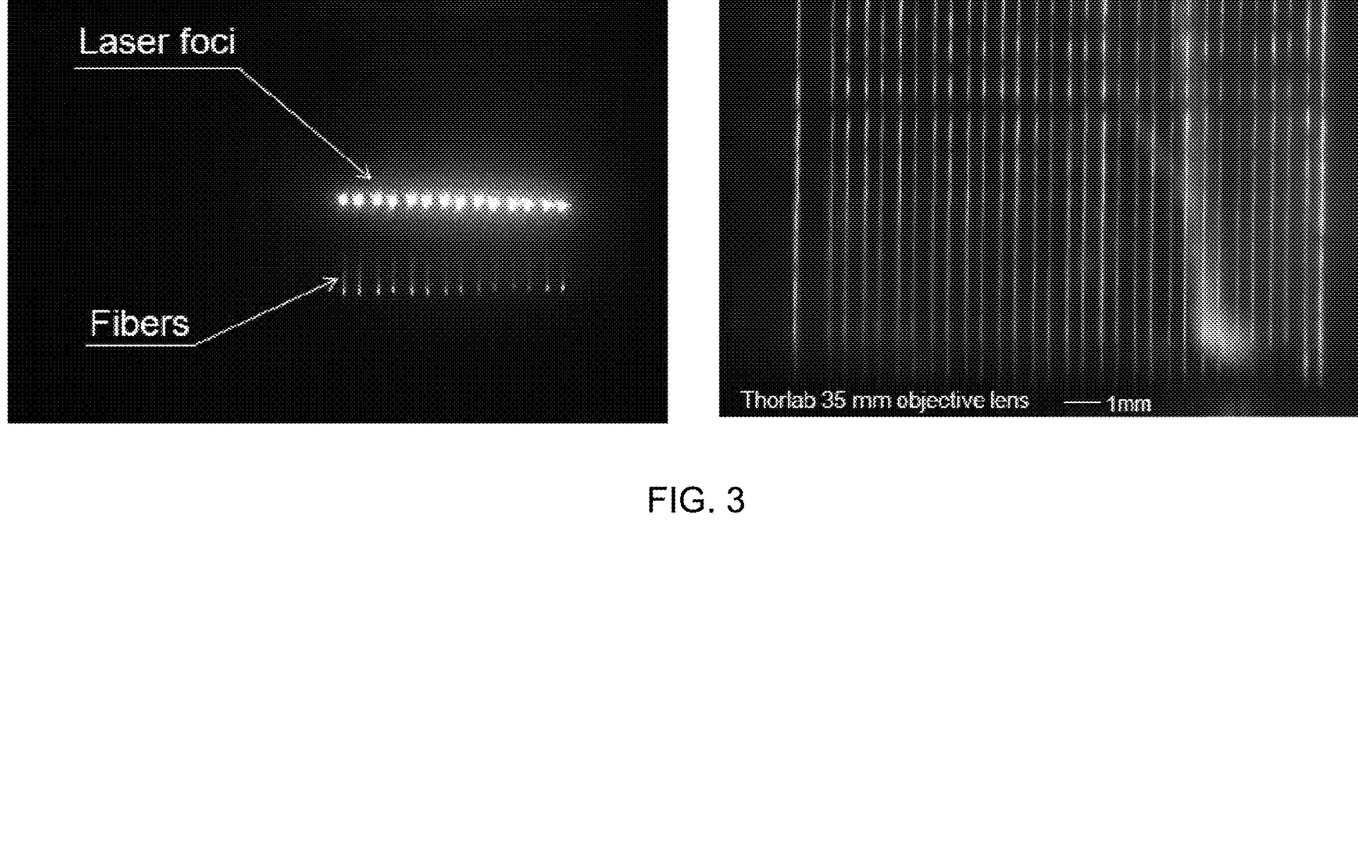
FIG. 3 is an example of parallel LCVD growth of carbon fibers.

Also in accordance with that Application, a large array of independently controlled lasers can be provided, growing an equally large array of fibers 70 in parallel, as illustrated in FIG. 2, showing how fiber LCVD can be massively parallelized from a filament lattice 100 by multiplication of the laser beams 80 inducing a plasma 90 around the tip of each fiber 70. Using a CtP (e.g., QWI) laser array for LCVD is a scientific first, and so was the use of a shallow depth of focus. It provides very beneficial results. Sample carbon fibers, such as those shown in FIG. 3, were grown in parallel. FIG. 3 shows parallel LCVD growth of carbon fibers—Left: Fibers during growth and Right: Resulting free standing fibers 10-12 µm in diameter and about 5 mm long.

Figure 4:
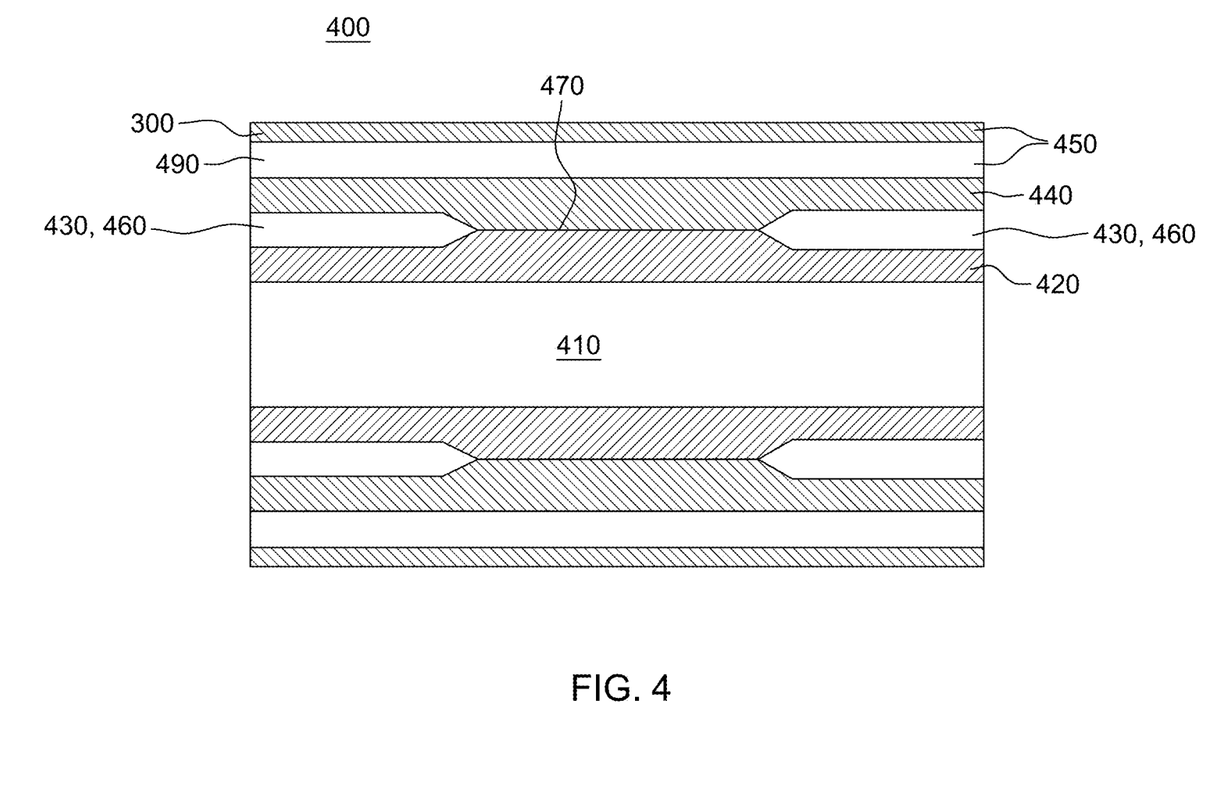
FIG. 4 illustrates in cross-sectional elevational view one embodiment of a multilayer functional fiber, in accordance with one embodiment of the present invention.

In accordance with one embodiment of the present invention, FIG. 4 illustrates a multilayer functional fiber 400 produced by a method which includes, for instance, providing a scaffold fiber 410, disposing a first electrode layer 420 enclosing scaffold fiber 410, disposing a functional layer 430 enclosing first electrode layer 420, disposing a second electrode layer 440 enclosing functional layer 430, and disposing a cladding layer 450 enclosing second electrode layer 440. In one or more implementations, functional layer 430 has a functional characteristic varying as a function of longitudinal position along functional layer 430. Examples of the functional characteristic include, without limitation, the thickness of the layer and the electrostriction of the layer material.

In one or more embodiments of multilayer functional fiber 400 of FIG. 4, functional layer 430 comprises an insulating region 460, wherein first electrode layer 420 is electrically isolated from second electrode layer 440, and a thermocouple junction region 470, wherein first electrode layer 420 is electrically coupled to second electrode layer 440, and first electrode layer 420 and second electrode layer 440 are made of different materials. In such embodiments, when coupled to suitable electrical and electronic circuitry, the Seebeck effect may be exploited to sense temperature in the neighborhood of thermocouple junction region 470. When coupled to different electrical and electronic circuitry, the Peltier effect may be exploited to actuate a heat transfer in the neighborhood of thermocouple junction region 470.

In one or more other embodiments of multilayer functional fiber 400 of FIG. 4, first electrode layer 420 comprises tungsten and second electrode layer 140 comprises rhenium to form a high-temperature thermocouple pair. In another embodiment, insulating region 460 comprises amorphous boron nitride. In yet another embodiment, insulating region 460 comprises lanthanum-modified lead zirconate titanate (PZT) as a layer of piezoelectric material.

Figure 5:
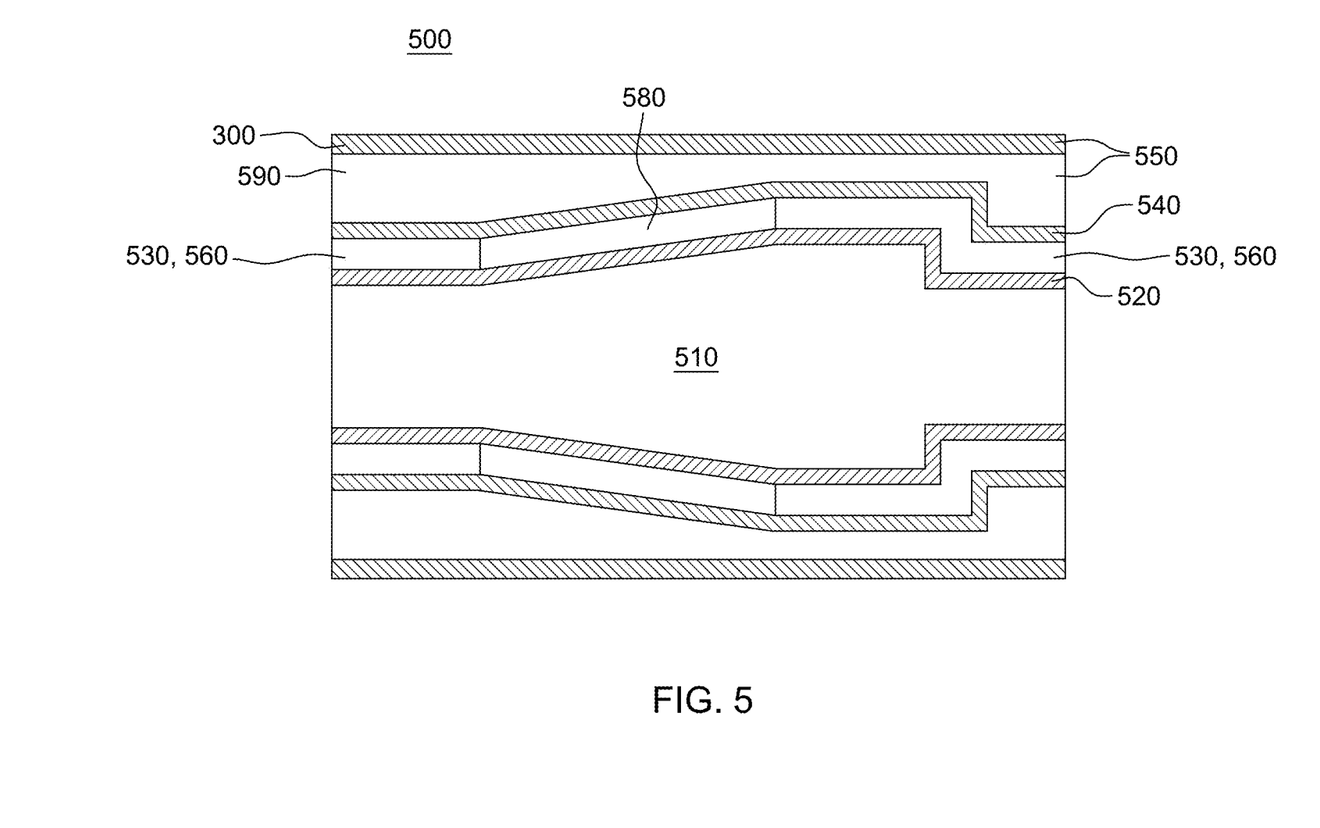
FIG. 5 illustrates in cross-sectional elevational view another embodiment of a multilayer functional fiber, in accordance with an alternative embodiment of the present invention.

In accordance with one or more other implementations of the present invention, FIG. 5 illustrates multilayer functional fiber 500 wherein functional layer 530 comprises an insulating region 560 wherein first electrode layer 520 is electrically isolated from second electrode layer 540 and an electrostrictive region 580, electrically coupled to first electrode layer 520 and second electrode layer 540. Electrostrictive region 580 comprises a material exhibiting substantially higher electrostriction than the material of insulating region 460. In this embodiment, when coupled to suitable electrical and electronic circuitry, the piezoelectric effect may be exploited to sense mechanical deformation (for example, strain or sound waves) in the neighborhood of electrostrictive region 580. When coupled to different electrical and electronic circuitry, the piezoelectric effect may be exploited to actuate a force in the neighborhood of electrostrictive region 580.

In one or more other embodiments of multilayer functional fiber 500 of FIG. 5, insulating region 560 comprises amorphous boron nitride. In another more detailed embodiment, electrostrictive region 580 has a conical taper. In yet another more detailed embodiment, electrostrictive region 580 comprises lead zirconate titanate.

In one or more alternate embodiments, the multilayer functional fiber of either FIG. 4 or FIG. 5, may include a scaffold fiber 410 and 510, respectively, and overcoat layer 300 which comprise an ordinarily solid material selected from a group consisting of boron, carbon, aluminum, silicon, titanium, zirconium, niobium, molybdenum, hafnium, tantalum, tungsten, rhenium, osmium, nitrogen, oxygen, and combinations thereof. As used herein, an "ordinarily solid material" means a material that is solid at a temperature of 20° Celsius and a pressure of 1 atmosphere.

In one or more further embodiments of FIGS. 4 and 5, cladding layer 450 (resp. 550) may include an interphase layer 490 (590) and an overcoat layer 300 enclosing interphase layer 490 (590). In yet another more detailed embodiment, interphase layer 490 (590) may include hexagonal boron nitride.

Figure 6:
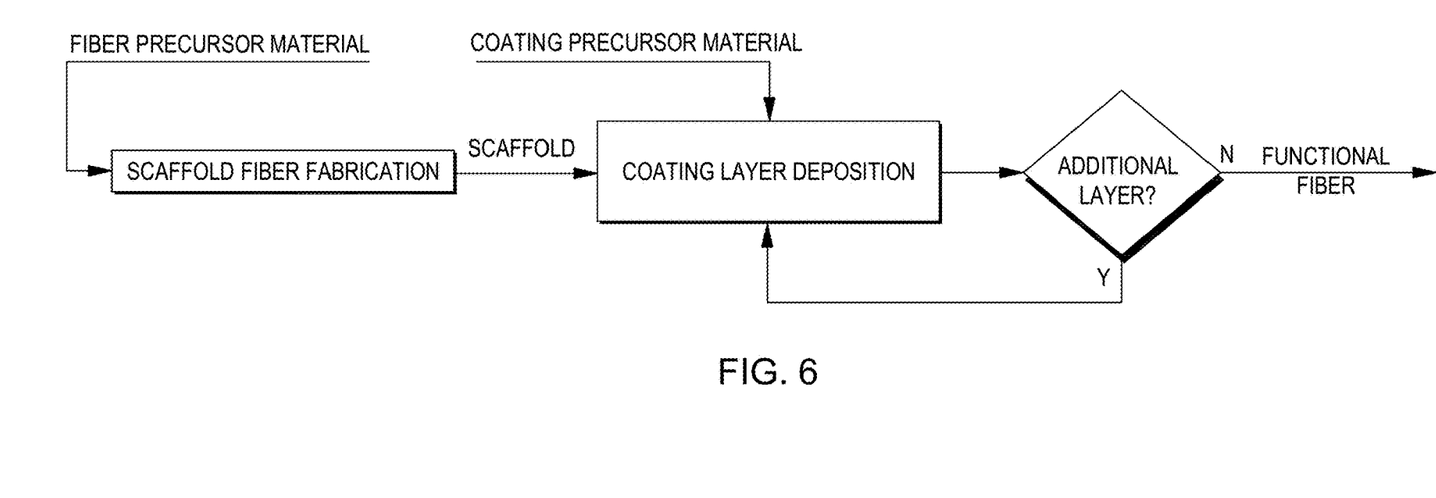
FIG. 6 depicts one embodiment of a process for producing a multilayer functional fiber, in accordance with one or more aspects of the present invention.

FIG. 6 depicts one embodiment of a process for producing a multilayer functional fiber. Note also that, in one or more implementations, the fibers, or one or more portions of the fibers, disclosed herein may be fabricated using the techniques described in PCT Application No. PCT/US2013/22053, entitled "High Strength Ceramic Fibers and Methods of Fabrication", which published on Dec. 5, 2013, as PCT Publication No. WO 2013/180764 A1, and which is hereby incorporated herein by reference in its entirety.

Those skilled in the art will note from the above discussion that provided herein, in one or more aspects, is a method of making a multilayer functional fiber, which includes: providing a scaffold fiber; disposing a first electrode layer enclosing the scaffold fiber; disposing a functional layer enclosing the first electrode layer, the functional layer having a functional characteristic varying as a function of longitudinal position along the functional layer; disposing a second electrode layer enclosing the functional layer; and disposing a cladding layer enclosing the second electrode layer. In one or more embodiments, the scaffold fiber includes an ordinarily solid material selected from a group consisting of boron, carbon, aluminum, silicon, titanium, zirconium, niobium, molybdenum, hafnium, tantalum, tungsten, rhenium, osmium, nitrogen, oxygen, and combinations thereof. In one or more implementations, the functional layer includes an insulating region, where the first electrode layer is electrically isolated from the second electrode layer, and a thermocouple junction region, wherein the first electrode layer is electrically coupled to the second electrode layer, and the first electrode layer and the second electrode layer are made of different materials.

In one or more embodiments, the multilayer functional fiber may include the scaffold fiber. Further, the first electrode layer may include tungsten and the second electrode layer may include rhenium. Still further, the insulating region may include amorphous boron nitride, or lanthanum-modified lead zirconate titanate.

In one or more embodiments, the functional layer may include an insulating region, where the first electrode layer is electrically isolated from the second electrode layer, and an electrorestrictive region, electrically coupled to the first electrode layer and the second electrode layer. Further, the insulating region may include amorphous boron nitride. Also, the electrorestrictive region may have a conical taper. Still further, the electrorestrictive region may include lead zirconate titanate.

In one or more embodiments, the cladding layer may include an interphase layer, and an overcoat layer enclosing the interphase layer. The overcoat layer may include an ordinarily solid material selected from a group consisting of boron, carbon, aluminum, silicon, titanium, zirconium, niobium, molybdenum, hafnium, tantalum, tungsten, rhenium, osmium, nitrogen, oxygen, and combinations thereof. Further, the interphase layer may include hexagonal boron nitride.

In one or more embodiments, a multilayer functional fiber is provided which includes a scaffold fiber, a first electrode layer enclosing the scaffold fiber, and a functional layer enclosing the first electrode layer. The functional layer has a functional characteristic varying as a function of longitudinal position along the functional layer. Further, the multilayer functional fiber includes a second electrode layer enclosing the functional layer, and a cladding layer enclosing the second electrode layer. In one or more implementations, the functional layer includes an insulating region, where the first electrode layer is electrically isolated from the second electrode layer, and a thermocouple junction region, where the first electrode layer is electrically coupled to the second electrode layer. Further, the first electrode layer and the second electrode layer may be made of different materials. In one or more embodiments, the functional layer includes an insulating region, where the first electrode layer is electrically isolated from the second electrode layer, and an electrorestrictive region, electrically coupled to the first electrode layer and the second electrode layer. The cladding layer may include an interphase layer, and an overcoat layer enclosing the interphase layer.

In one or more further aspects, a 1½-D printing process is disclosed herein, which includes the following defining characteristics: a material-agnostic ability to grow filaments; an ability to vary diameter along the length of the filament; a material-agnostic ability to vary composition along the length of the filament; and a material-agnostic ability to coat specific sections of filaments with a desired material, morphology and/or thickness.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. A method comprising:
using laser induced chemical vapor deposition and 1½-D printing to fabricate a functional fiber, the using comprising:

growing, using the laser induced chemical vapor deposition, a ceramic scaffold fiber, the ceramic scaffold fiber being a single fiber grown using laser induced chemical vapor deposition to provide structural reinforcement to a ceramic material matrix; and forming, by 1½-D laser printing, a functional pattern, providing one or more specific functions, on the ceramic scaffold fiber, the forming comprising:

forming multiple building blocks of the functional pattern along the ceramic scaffold fiber, the forming comprising for each building block:

selectively laser-printing an axisymmetric first electrode layer along a respective length section of the ceramic scaffold fiber;

selectively laser-printing an axisymmetric functional layer over the first electrode layer along the length section of the ceramic scaffold fiber by controlling the laser to control heat generated by a focused laser beam to break down precursor gases locally, to locally adjust a functional characteristic of the functional layer within the length section, the functional characteristic varying as a function of longitudinal position along the length section of the ceramic scaffold fiber;

laser-printing an axisymmetric second electrode layer over the functional layer;

laser-printing an axisymmetric cladding layer above the second electrode layer; and embedding the functional fiber in the ceramic material matrix to form a functional ceramic matrix composite structure.

2. The method of claim 1, wherein the ceramic scaffold fiber comprises an ordinarily solid material selected from a group consisting of boron, carbon, aluminum, silicon, titanium, zirconium, niobium, molybdenum, hafnium, tantalum, tungsten, rhenium, osmium, nitrogen, oxygen, and combinations thereof.

3. The method of claim 1, wherein:

the functional layer comprises an insulating region, wherein the first electrode layer is electrically isolated from the second electrode layer, and a thermocouple junction region, wherein the first electrode layer is electrically coupled to the second electrode layer; and the first electrode layer and the second electrode layer are made of different materials.

4. The method of claim 3, wherein the insulating region comprises amorphous boron nitride.

5. The method of claim 3, wherein the insulating region comprises lanthanum-modified lead zirconate titanate.

6. The method of claim 1, wherein the functional fiber is configured to facilitate sensing temperature of the material when embedded within the material.

7. The method of claim 6, wherein the first electrode layer comprises tungsten and the second electrode layer comprises rhenium.

8. The method of claim 1, wherein:

the functional layer comprises an insulating region, wherein the first electrode layer is electrically isolated from the second electrode layer, and an electrostrictive region, electrically coupled to the first electrode layer and the second electrode layer.

9. The method of claim 8, wherein the insulating region comprises amorphous boron nitride.

10. The method of claim 8, wherein the electrostrictive region has a conical taper.

11. The method of claim 8, wherein the electrostrictive region comprises lead zirconate titanate.

12. The method of claim 1, wherein the cladding layer comprises:

an interphase layer; and an overcoat layer enclosing said interphase layer.

13. The method of claim 12, wherein the overcoat layer comprises an ordinarily solid material selected from a group consisting of boron, carbon, aluminum, silicon, titanium, zirconium, niobium, molybdenum, hafnium, tantalum, tungsten, rhenium, osmium, nitrogen, oxygen, and combinations thereof.

14. The method of claim 12, wherein the interphase layer comprises hexagonal boron nitride.

15. The method of claim 1, further comprising selectively disposing another first electrode layer over the functional layer, and selectively disposing another functional layer over the another first electrode layer.

16. The method of claim 1, wherein the functional pattern provides the one or more specific functions, the one or more specific functions being selected from the group consisting of sensing, actuating, energy storage, energy absorption, energy release, and damping.

* * * * *